United States Patent
Hooper et al.

(10) Patent No.: US 12,406,911 B2
(45) Date of Patent: Sep. 2, 2025

(54) SEMICONDUCTOR DEVICE WITH EMBEDDED BATTERY AND METHOD THEREFOR

(71) Applicant: NXP USA, INC., Austin, TX (US)

(72) Inventors: Stephen Ryan Hooper, Queen Creek, AZ (US); Chanon Suwankasab, Pathumthani (TH); Chayathorn Saklang, Bangplee (TH); Crispulo Estira Lictao, Jr., Binan (PH); Amornthep Saiyajitara, Bangken (TH); Dominic (Pohmeng) Koey, Shah Alam (MY)

(73) Assignee: NXP USA, Inc., Austin, TX (US)

( * ) Notice: Subject to any disclaimer, the term of this patent is extended or adjusted under 35 U.S.C. 154(b) by 352 days.

(21) Appl. No.: 17/660,650

(22) Filed: Apr. 26, 2022

(65) Prior Publication Data
US 2023/0343683 A1    Oct. 26, 2023

(51) Int. Cl.
| | |
|---|---|
| *H01L 23/495* | (2006.01) |
| *H01L 21/56* | (2006.01) |
| *H01L 23/00* | (2006.01) |
| *H01L 23/31* | (2006.01) |
| *H02J 7/00* | (2006.01) |

(52) U.S. Cl.
CPC ........ *H01L 23/49575* (2013.01); *H01L 21/56* (2013.01); *H01L 23/3107* (2013.01); *H01L 23/49503* (2013.01); *H01L 23/49593* (2013.01); *H01L 24/48* (2013.01); *H02J 7/0063* (2013.01); *H01L 2224/48221* (2013.01)

(58) Field of Classification Search
CPC ............... H01L 23/49575; H01L 21/56; H01L 23/3107; H01L 23/49503; H01L 23/49593; H01L 24/48; H01L 21/50; H01L 23/49541; B81B 2201/0235; B81B 2201/0264; B81B 2207/012; B81B 2207/03; B81B 2207/098; B81C 1/0023; B81C 2203/0792; H02J 7/0063
USPC .......................................................... 257/666
See application file for complete search history.

(56) References Cited

U.S. PATENT DOCUMENTS

| | | | |
|---|---|---|---|
| 4,998,888 A | 3/1991 | Link et al. | |
| 5,180,645 A | 1/1993 | More | |
| 5,498,903 A | 3/1996 | Dixon et al. | |
| 6,109,530 A | 8/2000 | Larson et al. | |
| 6,284,406 B1 * | 9/2001 | Xing | H01M 10/0436 |
| | | | 429/96 |
| 6,375,780 B1 * | 4/2002 | Tuttle | G01S 13/825 |
| | | | 156/227 |
| 6,809,646 B1 * | 10/2004 | Lee | G07C 9/28 |
| | | | 235/487 |
| 7,088,074 B2 | 8/2006 | Clevenger et al. | |
| 9,710,126 B2 * | 7/2017 | Engström | G06F 3/0482 |
| 10,340,211 B1 * | 7/2019 | Suwankasab | H01L 23/49575 |
| 10,516,190 B2 | 12/2019 | Keates et al. | |
| 2006/0011931 A1 | 1/2006 | Sanchez | |

(Continued)

*Primary Examiner* — Andres Munoz

(57) ABSTRACT

A method of manufacturing a packaged semiconductor device is provided. The method includes affixing a sensor system to a die pad portion of a leadframe. A battery is affixed to the lead frame including a first terminal of the battery affixed to a first leg of the leadframe and a second terminal of the battery affixed to a second leg of the leadframe. An encapsulant encapsulates the sensor system, battery, and leadframe.

6 Claims, 3 Drawing Sheets

(56) References Cited

U.S. PATENT DOCUMENTS

| | | | |
|---|---|---|---|
| 2017/0213783 A1* | 7/2017 | Meiser | H01L 24/37 |
| 2017/0253476 A1* | 9/2017 | Shibuya | B81B 7/0038 |
| 2017/0271279 A1* | 9/2017 | Du | H02S 40/34 |
| 2019/0109072 A1 | 4/2019 | David et al. | |
| 2020/0321286 A1 | 10/2020 | Hooper et al. | |
| 2021/0287477 A1* | 9/2021 | Langer | G07G 1/0072 |
| 2024/0178111 A1* | 5/2024 | Saklang | H01L 23/49555 |

* cited by examiner

SEMICONDUCTOR DEVICE WITH EMBEDDED BATTERY AND METHOD THEREFOR

BACKGROUND

Field

This disclosure relates generally to semiconductor devices, and more specifically, to semiconductor devices with an embedded battery and method of forming the same.

Related Art

Semiconductor devices are often found in a large spectrum of electronic products—from sewing machines to washing machines, from automobiles to cellular telephones, and so on. Many of these semiconductor devices may include sensitive systems and may be produced in high volumes to drive costs down. However, some factors such as manufacturing processes may be optimized for product costs but could adversely affect or constrain applications using these semiconductor devices. It is therefore desirable, as technology progresses, to accommodate flexible and less constrained applications of these semiconductor devices while keeping product costs in focus.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device having an embedded battery. The semiconductor device includes one or more semiconductor die mounted on a package leadframe along with a battery mounted on the leadframe. The one or more semiconductor die, battery, and leadframe are encapsulated with an encapsulant. In a self-contained manner, the semiconductor device is configured to operate using the battery as its power source. The semiconductor device is further configured to communicate wirelessly with an external device. The self-contained semiconductor device configured with wireless communication capability is especially useful for sensor systems, for example. In this manner, a self-contained, self-powered sensor system could be placed virtually anywhere.

Figure 1:
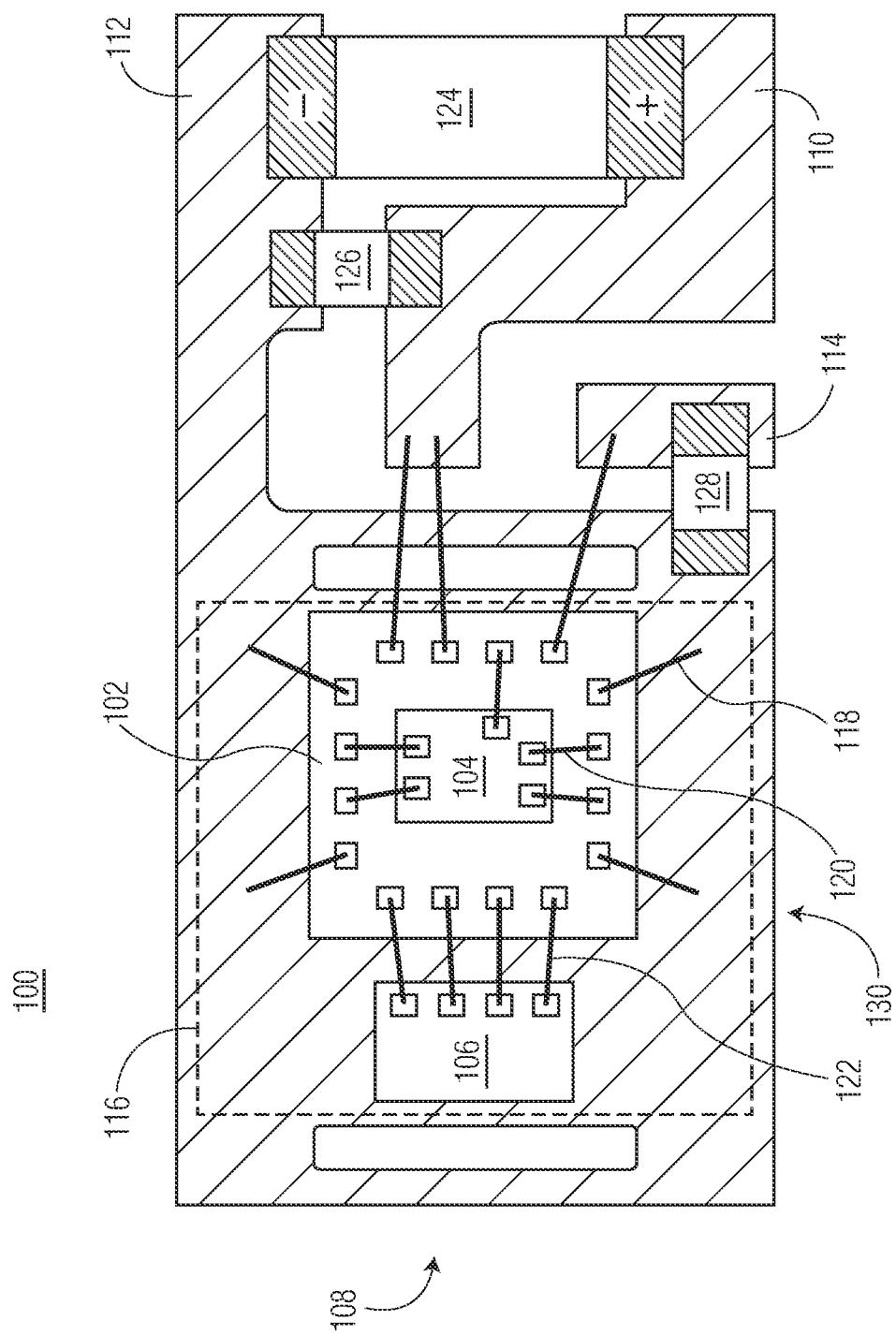
FIG. 1 illustrates, in a simplified plan view, an example semiconductor device having an embedded battery at a stage of manufacture in accordance with an embodiment.

FIG. 1 illustrates, in a simplified plan view, an example semiconductor device 100 having an embedded battery at a stage of manufacture in accordance with an embodiment. At this stage, the semiconductor device 100 includes a sensor system 130, a battery 124, and components 126, 128 mounted on a package leadframe 108. In this embodiment, the sensor system 130 is affixed to a die pad portion 116 of the leadframe 108 and the battery 124 is affixed to power legs 110, 112 of the leadframe 108. The term leg of the leadframe, as used herein, generally refers to a portion of the package leadframe suitable for connection of a bond wire and/or an internal component terminal (e.g., battery 124 and components 126, 128 terminals). Simplified side-on cross-sectional views of the example semiconductor device 100 taken are shown in stages of manufacture depicted in FIG. 2 and FIG. 3.

The sensor system 130 includes a controller subsystem 102, a wireless communication subsystem 106, and a sensor 104. The sensor system 130 is configured to sense environmental conditions, changes, and/or events and wirelessly communicate information based on the sensed conditions, changes, and/or events. In this embodiment, the controller subsystem 102 includes circuitry configured to control functions of the sensor system 130 such as monitoring the sensor 104 and sending and/or receiving signals by way of the communication subsystem 106. The sensor system 130 may be implemented as a single system-on-chip (SoC) semiconductor die or may be implemented as a plurality of semiconductor die (e.g., one die per subsystem).

In this embodiment, the controller subsystem 102 is formed as a semiconductor die 102 mounted on a die pad portion 116 of the leadframe 108. The sensor 104 is formed as a micro-electromechanical system (MEMS) semiconductor die 104 mounted on the first semiconductor die 102 and the communication subsystem 106 is formed as a semiconductor die 106 mounted on the die pad portion 116 of the leadframe. In this embodiment, bond wires 118 interconnect the bond pads of the semiconductor die 102 with the leadframe 108, bond wires 120 interconnect the bond pads of the semiconductor die 102 with the bond pads of the sensor 104, and bond wires 122 interconnect bond pads of the semiconductor die 102 with the bond pads of the communication semiconductor die 106. The number, location, and arrangement of bond pads and interconnectivity formed by bond wires 118-122 are examples chosen for illustration purposes. For discussion purposes herein, the term "controller die 102" may be used interchangeably with the controller subsystem 102 and the semiconductor die 102. Likewise, the term "sensor die 104" may be used interchangeably with the sensor 104 and the MEMS semiconductor die 104, and the term "communication die 106" may be used interchangeably with the communication subsystem 106 and the semiconductor die 106.

The controller subsystem 102 is coupled to the sensor 104 and the communication subsystem 106. The controller subsystem 102 may include circuitry configured to monitor one or more output signals from the sensor 104 and based on the one or more output signals, send communication signals (e.g., alerts, status indications, data) by way of the communication subsystem 106. The controller subsystem 102 may further include circuitry configured to receive communication signals (e.g., commands, information) by way of the communication subsystem 106. The controller die 102 has an active side (e.g., major side having circuitry, bond pads) and a backside (e.g., major side opposite of the active side). The controller die 102 includes bond pads located at the active side of the semiconductor die. The controller die 102 may be formed from any suitable semiconductor material, such as silicon, germanium, gallium arsenide, gallium nitride, and the like. In addition to the controller subsystem, the controller die 102 may further include any digital circuits, analog circuits, RF circuits, memory, processor, the like, and combinations thereof at the active side.

The sensor 104 is coupled to the controller subsystem 102 and the communication subsystem 106. The sensor 104 may include any suitable sensor such as an accelerometer, pressure sensor, temperature sensor, etc. The sensor die 104 has an active side (e.g., major side having circuitry, bond pads) and a backside (e.g., major side opposite of the active side). The sensor die 104 includes bond pads located at the active side of the die. The sensor of the sensor die 104 may include one or more micromachined devices. The sensor die 104 may be formed from any suitable semiconductor material, such as silicon, germanium, gallium arsenide, gallium nitride, and the like. In addition to the sensor, the sensor die 104 may further include any digital circuits, analog circuits, RF circuits, memory, processor, the like, and combinations thereof at the active side.

The communication subsystem 106 is coupled to the controller subsystem 102 and the sensor 104. The communication subsystem 106 may include circuitry configured as a transmitter, receiver, or transceiver sufficient to communicate wirelessly with an external device separate from the semiconductor device 100. For example, the communication subsystem 106 may communicate information based on an output signal of the sensor 104 of the sensor system 130. The communication subsystem 106 may further include an antenna. The communication subsystem 106 may be configured for one or more suitable wireless communication protocols (e.g., Bluetooth, Zigbee, Z-Wave, IoT, Wi-Fi, cellular). The communication die 106 has an active side (e.g., major side having circuitry, bond pads) and a backside (e.g., major side opposite of the active side). The communication die 106 includes bond pads located at the active side of the die. The communication die 106 may be formed from any suitable semiconductor material, such as silicon, germanium, gallium arsenide, gallium nitride, and the like. In addition to the communication subsystem, the communication die 106 may further include any digital circuits, analog circuits, RF circuits, memory, processor, the like, and combinations thereof at the active side. In some embodiments, the communication subsystem may be incorporated within the controller die 102 and the communication die 106 may serve as an antenna.

The leadframe 108 includes power legs 110 and 112, signal leg 114, and die pad portion 116. The power legs 110 and 112 of the leadframe 108 are configured for connection of an internal power source (e.g., battery 124). In this embodiment, the power leg 112 may be characterized as a ground power leg or ground leg 112 of the leadframe 108. The leadframe 108 may be formed from any suitable metal materials, such as copper, nickel, aluminum, iron, or alloys thereof, for example. The leadframe 108 may be bare, partially plated, or plated with another metal or alloy. In this embodiment, the power legs 110 and 112, signal leg 114, and die pad portion 116 are all self-contained when encapsulated. Portions of the leadframe 108 such as tie bars and dam bars discarded during package singulation not shown for illustration purposes.

The battery 124 may be characterized as a surface mount battery including terminals configured for attachment to the power legs 110 and 112 of the leadframe 108. In this embodiment, the negative terminal (−) of the battery 124 is connected to the power (e.g., ground) leg 112 and die pad portion 116 and the positive terminal (+) of the battery 124 is connected to the power leg 110. The battery 124 may be formed as a single cell or plurality of cells configured to provide a predetermined nominal voltage and current capacity (e.g., 1.5 volts and 100 microampere-hours). In this embodiment, the battery 124 is configured to supply an operating voltage and current to the sensor system 130 sufficient for the semiconductor device 100 to operate in a self-contained manner over a predetermined period of time. The battery 124 may be formed from any suitable materials and chemistries.

The components 126 and 128 may be characterized as surface mount passive components (e.g., resistor, capacitor, inductor, diode) including terminals configured for attachment to the leadframe 108. In this embodiment, the component 126 (e.g., bypass capacitor) is attached between the power legs 110 and 112 and the component 128 (e.g., signal termination resistor) is attached between the signal leg 114 and the power leg 112. The number, type, and location of surface mount passive components are examples chosen for illustrative purposes.

Figure 2:
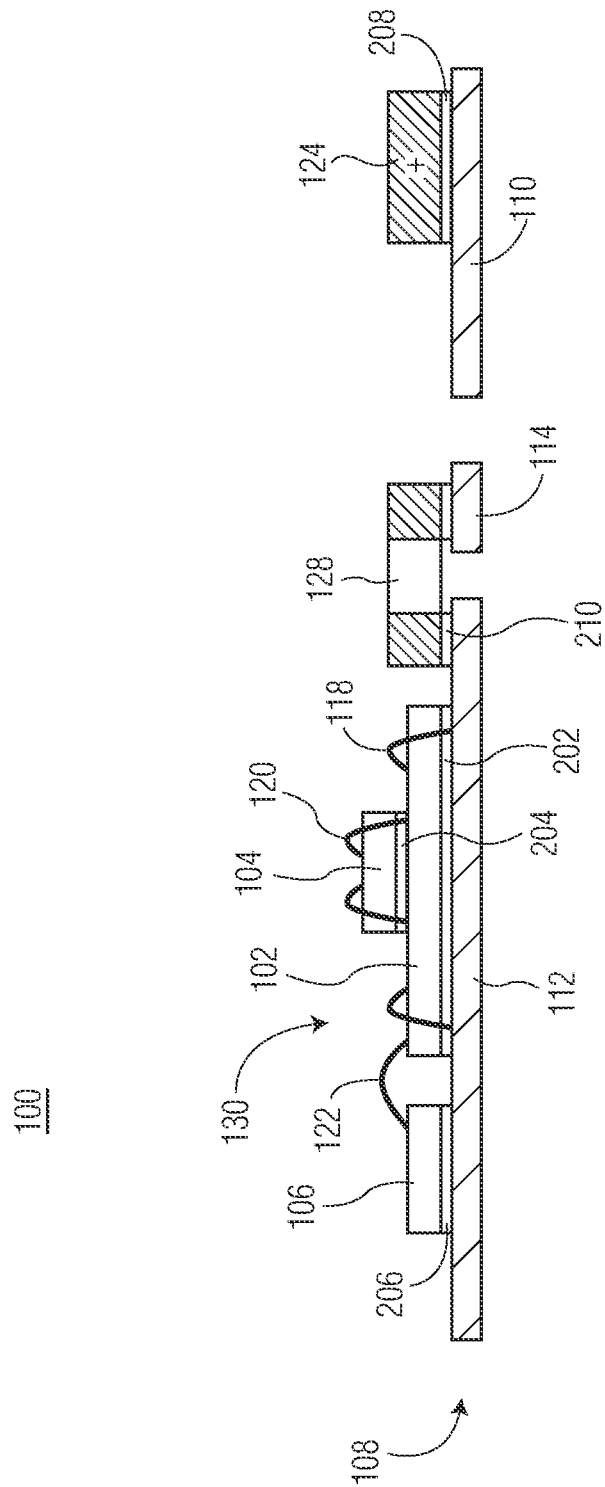
FIG. 2 and FIG. 3 illustrate, in simplified side-on cross-sectional views, the example semiconductor device at stages of manufacture in accordance with an embodiment.
Figure 3:
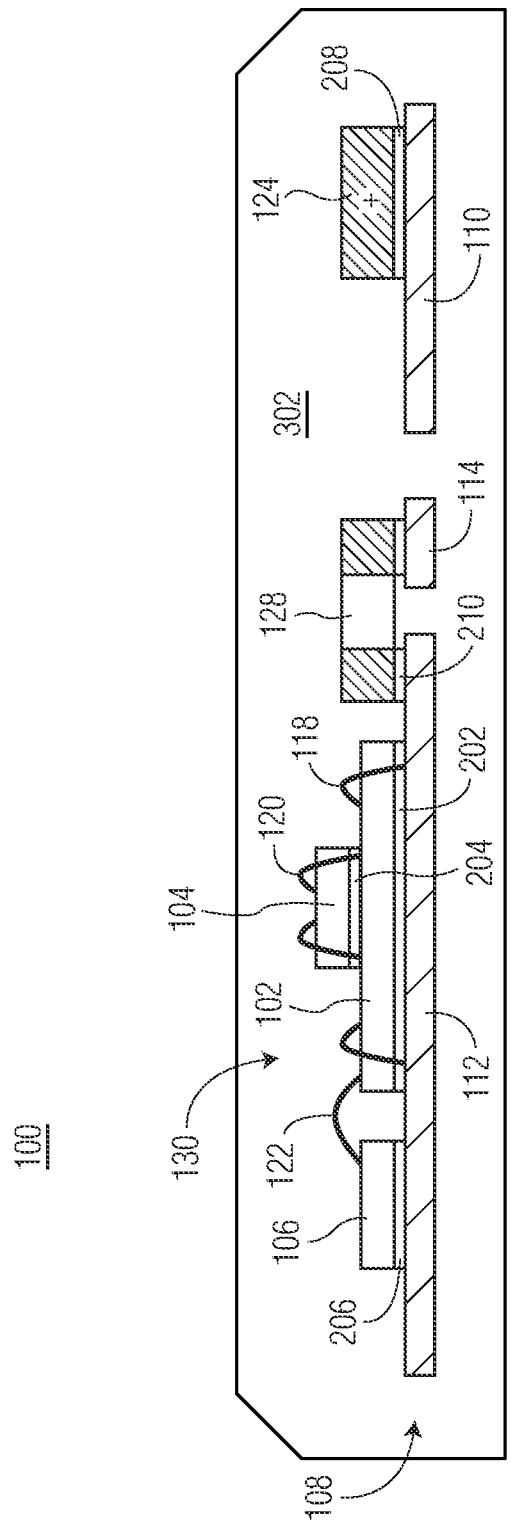

FIG. 2 and FIG. 3 illustrate, in simplified side-on cross-sectional views, the example semiconductor device 100 at stages of manufacture in accordance with an embodiment.

FIG. 2 illustrates, in a simplified side-on cross-sectional view, the example semiconductor device 100 at a stage of manufacture in accordance with an embodiment. At this stage, the semiconductor device 100 includes the sensor system 130, battery 124, and components 126, 128 mounted on the package leadframe 108. In this embodiment, the semiconductor die 102 of the sensor system 130 is mounted on the die pad portion of the leadframe 108 in an active-side-up orientation. For example, the backside of the semiconductor die 102 is attached to top side of the die pad portion by way of a die attach material 202. Likewise, the semiconductor die 106 of the sensor system 130 is mounted on the die pad portion of the leadframe 108 in an active-side-up orientation with the backside of the semiconductor die 106 attached to top side of the die pad portion by way of a die attach material 206. In this embodiment, the sensor die 104 is mounted on the active side of the semiconductor die 102 in an active-side-up orientation with the backside of the sensor die 104 attached to active side of the semiconductor die 102 by way of a die attach material 204. In this embodiment, the die attach materials 202 and 206 may be characterized as a conductive the die attach material and the die attach material 204 may be characterized as a non-conductive die attach material. For example, die attach materials 202 and 206 may be formed as a silver-filled epoxy, solder paste, or conductive DAF and the die attach material 204 may be formed as a non-conductive epoxy or DAF. In other embodiments, other die attach materials and methods may be utilized. The term conductive, as used herein, generally refers to the property of electrical conductivity.

In the embodiment of FIG. 2, the positive terminal (+) of the battery 124 is conductively attached to the power leg 110 of the leadframe 108 by way of a conductive attachment material 208. Similarly, a first terminal of the component 128 is conductively attached to the power leg 112 of the leadframe 108 and a second terminal of the component 128 is conductively attached to the signal leg 114 of the leadframe 108 by way of conductive attachment material 210. In this embodiment, the die attach materials 208 and 210 may be characterized as conductive die attach materials such as silver-filled epoxy, solder paste, conductive DAF, or the like. It may be desirable to utilize a common attachment material for affixing the semiconductor die, battery terminals, and component terminals to the leadframe. In this manner, the assembly process can be streamlined and thus, reduce costs.

After the sensor system 130, battery 124, and components 126, 128 are mounted on the package leadframe 108, the semiconductor die 102, sensor 104, and semiconductor die 106 of the sensor system 130 are interconnected with one another and the leadframe 108 by way of bond wires 118-122. For example, a first set of bond pads (not shown) of the semiconductor die 102 are conductively connected to the leadframe 108 by way of bond wires 118. Likewise, a second set of bond pads (not shown) of the semiconductor die 102 are conductively connected to the sensor 104 by way of bond wires 120, and a third set of bond pads (not shown) of the semiconductor die 102 are conductively connected to the semiconductor die 106 by way of bond wires 122. The bond wires 118-122 may be formed from a suitable metal material such as copper, silver, gold, or alloys thereof, for example. The number, location, and arrangement of bond wires 118-122 depicted in FIG. 2 are examples chosen for illustration purposes. bond wires 120 are configured to interconnect FIG. 3 illustrates, in a simplified side-on cross-sectional view, the example semiconductor device 100 at a subsequent stage of manufacture in accordance with an embodiment. At this stage, the semiconductor device 100 is encapsulated and singulated. In this embodiment, the semiconductor device 100 includes an encapsulant 302 encapsulating the sensor system 130, battery 124, components 126, 128, and package leadframe 108. The encapsulant 302 may be an epoxy molding compound dispensed during an injection molding encapsulation operation, for example. After the molding operation, the semiconductor device 100 is singulated (e.g., trimmed) from remaining portions of a leadframe strip (e.g., tie bars) which may extend through and outside of the encapsulant. In this embodiment, no portion of the leadframe 108 extends outside of the encapsulant for external connectivity.

In this embodiment, the semiconductor device 100 is configured to form a self-contained sensor system after encapsulation and singulation. For example, the self-contained sensor system of the semiconductor device 100 includes an embedded battery power source configured to supply an operating voltage and current to the sensor system. The embedded battery power source is sufficient for the sensor system 130 of the semiconductor device 100 to operate (e.g., sense, monitor, communicate) in a self-contained manner over a predetermined period of time.

In some embodiments, an external antenna may be coupled to the sensor system 130 to augment wireless communication. For example, an opening may be formed in the encapsulant 302 such that an external antenna may be affixed to the sensor system 130 in a manner sufficient to extend the range and/or enhance the quality of the wireless communication capabilities of the sensor system 130.

Generally, there is provided, a method of manufacturing a packaged semiconductor device including affixing a sensor system to a die pad portion of a leadframe; affixing a battery to the lead frame, a first terminal of the battery affixed to a first leg of the leadframe and a second terminal of the battery affixed to a second leg of the leadframe; and encapsulating with an encapsulant the sensor system, battery, and leadframe. The battery may be configured to supply an operating voltage and current to the sensor system. The sensor system may include a wireless communication subsystem configured for communication with an external device separate from the packaged semiconductor device, the communication including an output signal of the sensor system. The affixing the sensor system to the die pad portion may include affixing a semiconductor die to the die pad portion of the leadframe. The method may further include connecting a first bond pad of the semiconductor die to the first leg by way of a first bond wire and connecting a second bond pad of the semiconductor die to the second leg by way of a second bond wire. The sensor system may further include a MEMS sensor affixed to an active side of the semiconductor die. The method may further include, after encapsulating with the encapsulant, trimming to remove portions of the leadframe extending outside of the encapsulant. The second leg may be connected to the die pad portion of the leadframe. The method may further include, before encapsulating with the encapsulant, affixing a passive component to the lead frame, a first terminal of the passive component affixed to the first leg of the leadframe and a second terminal of the passive component affixed to the second leg of the leadframe, the passive component encapsulated by way of the encapsulating with the encapsulant.

In another embodiment, there is provided, a semiconductor device including a sensor system affixed to a die pad portion of a leadframe; a battery affixed to the lead frame, a first terminal of the battery affixed to a first leg of the leadframe and a second terminal of the battery affixed to a second leg of the leadframe; and an encapsulant encapsulating the sensor system, battery, and leadframe. The battery may be configured to supply an operating voltage and current to the sensor system. The sensor system may include a wireless communication subsystem configured for communication with an external device separate from the packaged semiconductor device, the communication based on an output signal of the sensor system. The sensor system affixed to the die pad portion may include a semiconductor die affixed to the die pad portion of the leadframe. The semiconductor device may further include a first bond pad of the semiconductor die connected to the first leg by way of a first bond wire and a second bond pad of the semiconductor die connected to the second leg by way of a second bond wire. The encapsulated sensor system, battery, and leadframe may be configured to form a self-contained sensor system.

In yet another embodiment, there is provided, a method of manufacturing a packaged semiconductor device including affixing a sensor system to a die pad portion of a leadframe; affixing a battery to the lead frame, a first terminal of the battery affixed to a first leg of the leadframe and a second terminal of the battery affixed to a second leg of the leadframe; and encapsulating with an encapsulant the sensor system, battery, and leadframe to form a self-contained sensor system. The battery may be configured to supply an operating voltage and current to the sensor system. The affixing the sensor system to the die pad portion may include affixing a semiconductor die to the die pad portion of the leadframe. The method may further include connecting a first bond pad of the semiconductor die to the first leg by way of a first bond wire and connecting a second bond pad of the semiconductor die to the second leg by way of a second bond wire. The sensor system may be configured to wirelessly transmit an output signal of the sensor system to an external device separate from the packaged semiconductor device.

By now it should be appreciated that there has been provided, a semiconductor device having an embedded battery. The semiconductor device includes one or more semiconductor die mounted on a package leadframe along with a battery mounted on the leadframe. The one or more semiconductor die, battery, and leadframe are encapsulated with an encapsulant. In a self-contained manner, the semiconductor device is configured to operate using the battery as its power source. The semiconductor device is further configured to communicate wirelessly with an external device. The self-contained semiconductor device configured with wireless communication capability is especially useful for sensor systems, for example. In this manner, a self-contained, self-powered sensor system could be placed virtually anywhere.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device comprising:
    a sensor system affixed to a die pad portion of a leadframe;
    an embedded battery affixed to the leadframe such that a first terminal of the embedded battery is affixed to a first leg of the leadframe and a second terminal of the embedded battery affixed to a second leg of the leadframe; and
    an encapsulant wholly encapsulating the sensor system, the embedded battery, and the leadframe such that no portion of the sensor system, the embedded battery, or the leadframe extends outside of the encapsulant.

2. The packaged semiconductor device of claim 1, wherein the embedded battery comprises a surface mount battery and is configured to supply an operating voltage and current to the sensor system.

3. The packaged semiconductor device of claim 1, wherein the sensor system includes a wireless communication subsystem configured to wirelessly communicate information based on an output signal of the sensor system.

4. The packaged semiconductor device of claim 1, wherein the sensor system affixed to the die pad portion includes a semiconductor die affixed to the die pad portion of the leadframe in an active-side-up orientation.

5. The packaged semiconductor device of claim 4, further comprising a first bond pad of the semiconductor die connected to the first leg by way of a first bond wire and a second bond pad of the semiconductor die connected to the second leg by way of a second bond wire.

6. The packaged semiconductor device of claim 1, wherein the sensor system, the embedded battery, and the leadframe wholly encapsulated with the encapsulant are configured to form a self-contained sensor system.

* * * * *